United States Patent
Carcasi et al.

(10) Patent No.: US 11,262,657 B2
(45) Date of Patent: Mar. 1, 2022

(54) SYSTEM AND METHOD OF PLANARIZATION CONTROL USING A CROSS-LINKABLE MATERIAL

(71) Applicant: Tokyo Electron Limited, Tokyo (JP)

(72) Inventors: Michael Carcasi, Austin, TX (US); Ryan Burns, Austin, TX (US); Mark Somervell, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 238 days.

(21) Appl. No.: 16/511,211

(22) Filed: Jul. 15, 2019

(65) Prior Publication Data
US 2021/0018839 A1  Jan. 21, 2021

(51) Int. Cl.
| G03F 7/09 | (2006.01) |
|---|---|
| G03F 7/38 | (2006.01) |
| G03F 7/16 | (2006.01) |
| G03F 7/20 | (2006.01) |
| G03F 7/30 | (2006.01) |

(52) U.S. Cl.
CPC .............. *G03F 7/094* (2013.01); *G03F 7/162* (2013.01); *G03F 7/168* (2013.01); *G03F 7/2002* (2013.01); *G03F 7/30* (2013.01); *G03F 7/38* (2013.01)

(58) Field of Classification Search
CPC .......... G03F 7/038; G03F 7/039; G03F 7/094; G03F 7/162; G03F 7/168; G03F 7/2002; G03F 7/2022; G03F 7/30; G03F 7/38
See application file for complete search history.

(56) References Cited

U.S. PATENT DOCUMENTS

| 5,900,346 | A | 5/1999 | Sinta et al. |
|---|---|---|---|
| 2006/0046166 | A1* | 3/2006 | Yang ........................ H01L 22/12 430/30 |
| 2006/0094204 | A1* | 5/2006 | Isono ....................... G03F 7/091 438/437 |
| 2009/0061331 | A1* | 3/2009 | Nakano ............... G03F 7/70925 430/30 |
| 2011/0033799 | A1* | 2/2011 | Watanabe ............. G03F 7/0397 430/270.1 |
| 2015/0255302 | A1* | 9/2015 | Yoon ................. H01L 21/32115 438/14 |

OTHER PUBLICATIONS

Sharp, B.L., et al., "Positive-tone Crosslinked Molecular Resist Based on Acid-catalyzed Depolymerization," Journal of Vacuum Science & Technology B, vol. 35, No. 6, Nov. 2017 (20 pages).*

(Continued)

*Primary Examiner* — Brittany L Raymond
(74) *Attorney, Agent, or Firm* — Wood Herron & Evans LLP

(57) ABSTRACT

Described herein are technologies to facilitate device fabrication, especially those that involve spin coatings of a substrate. More particularly, technologies described herein facilitate the planarization (i.e., flatness) of spin coatings during the device fabrication to form a uniformly planar film or layer on the substrate. This abstract itself is not intended to limit the scope of this patent. The scope of the present invention is pointed out in the appending claims.

37 Claims, 7 Drawing Sheets

(56) References Cited

OTHER PUBLICATIONS

Cheng, Jing, "Toward Sub-10NM Lithographic Processes: Epoxy-Based Negative Tone Molecular Resists And Directed Self-Assembly (DSA) Of High c Block Copolymers," Georgia Institute of Technology, Aug. 2013 (182 pages).

Zhao, J.H., et al., "The Effect Of Crosslinked And Branched Polyethylene Molecules On The Thermo-Mechanical Properties," 23rd Nordic Seminar on Computational Mechanics, KTH, Stockholm, Sweden, 2010 (4 pages).

Gierszewska-Druzynska, Magdalena, et al., "Effect Of Ionic Crosslinking On Density Of Hydrogel Chitosan Membranes," Progress on Chemistry and Application of Chitin and Its Derivatives, vol. XVIII, 2013, pp. 49-58 (10 pages).

Min, Haodi, et al., "UV-Curable Nanoimprint Resist with Liquid Volume-Expanding Monomers," Department of Materials Schience and Engineering, Shenzhen Key Laboratory of Nanoimprint Technology, Southern University of Science and Technology, Shenzhen, Guangdong 518055, China (2 pages).

Sharp, B.L., et al., "Novel Crosslinked Molecular Resists Based on Acid-Catalyzed Depolymerization," School of Chemistry and Biochemistry, Georgia Institute of Technology (2 pages).

Sharp, B.L., et al., "Novel crosslinked molecular resists based on acid-catalyzed depolymerization," School of Chemistry and Biochemistry, Georgia Institute of Technology (16 pages).

Narcross, Hannah, et al., "Phenol-functionalized polymerization control additives for negative tone epoxide crosslinking molecular resists," Journal of Vacuum Science & Technology B, Nov. 2018 (8 pages).

Greene, T.W., et al., "Greene's Protective Groups in Organic Synthesis," Fourth Edition, John Wiley & Sons, Inc., 2007 (26 pages).

* cited by examiner

SYSTEM AND METHOD OF PLANARIZATION CONTROL USING A CROSS-LINKABLE MATERIAL

BACKGROUND

In the manufacture of micro-scale or nano-scale devices, various fabrication processes are executed and repeatedly performed to create functional device elements on a substrate. Examples of micro-scale or nano-scale devices include semiconductor devices, electronic devices, mechanical devices, etc. Examples of fabrication processing include processes for film-forming, etching, patterning, cleaning, doping, annealing, treating, planarizing, etc.

Typically, these devices are produced as part of a layered device fabrication process of, for example, a substrate. In some instances, a coating is "spun-on" to the substrate to form a uniform layer or film. Spin coating a material enhances its uniformity in coverage and planarization. As used herein, planarization or planar refers to the consistent flatness of a layer or film.

Spin coating is a procedure used to deposit uniform thin films to flat substrates. Usually, a small amount of coating material is applied on the center of the substrate, which is either spinning at low speed or not spinning at all. The substrate is then rotated at high speed in order to spread the coating material by centrifugal force. A machine used for spin coating is called a spin coater, or simply spinner.

Rotation is continued while the fluid spins off the edges of the substrate, until the desired thickness of the film is achieved. The applied solvent is usually volatile, and simultaneously evaporates. So, the higher the angular speed of spinning, the thinner the film. The thickness of the film also depends on the material properties, such as the viscosity and concentration of the solution and the solvent.

Traditionally, the micro- and nano-fabrication of semiconductor transistors are formed in-plane—thus are often referred to as two-dimensional (2D) or planar devices. When formed, the semiconductor transistors are interconnected via metallization/wiring layers formed in overlying layers of circuitry. While scaling efforts have greatly increased the number of transistors per unit area in 2D circuits, the scaling efforts introduce new and greater challenges as scaling enters single digit nanometer-scale device features.

In addition, device fabricators have expressed a desire for out-of-plane, or three-dimensional (3D), non-planar devices. The decreasing scales for fabrication coupled with the ascendance of device features into the third dimension have led to increasingly complex topography. Thus, it is more difficult than ever to achieve planarization.

Planarization is a process employed in the fabrication of devices, to increase the flatness or planarity of the surface of the semiconductor substrate. As the substrate proceeds through a variety of intermediate steps to prepare the finished product, layers of different materials, having different shapes and dimensions, are deposited. Further, portions of those layers are intentionally removed during the fabrication process. One result of these processing procedures is that the flatness or planarity of the substrate surface is decreased.

SUMMARY

Described herein are technologies to facilitate planarizing the surface of a substrate. To improve the substrate's planarity, a number of techniques have been developed. These include oxidation of the surface; chemical etching; taper control by ion implant damage; film deposition using a low-melting point glass; resputtering; polyimide film deposition; liquid epoxy or resin deposition; spin-on glass materials; etch-back processes; and chemical-mechanical polishing.

More particularly, technologies described herein facilitate the planarization (i.e., flatness) of spin coatings during the device fabrication process to form a uniformly planar film or layer on the substrate using a cross-linkable planarization material, which can be de-polymerized via acid catalysis following the application of a localized energy source.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Figure 1:
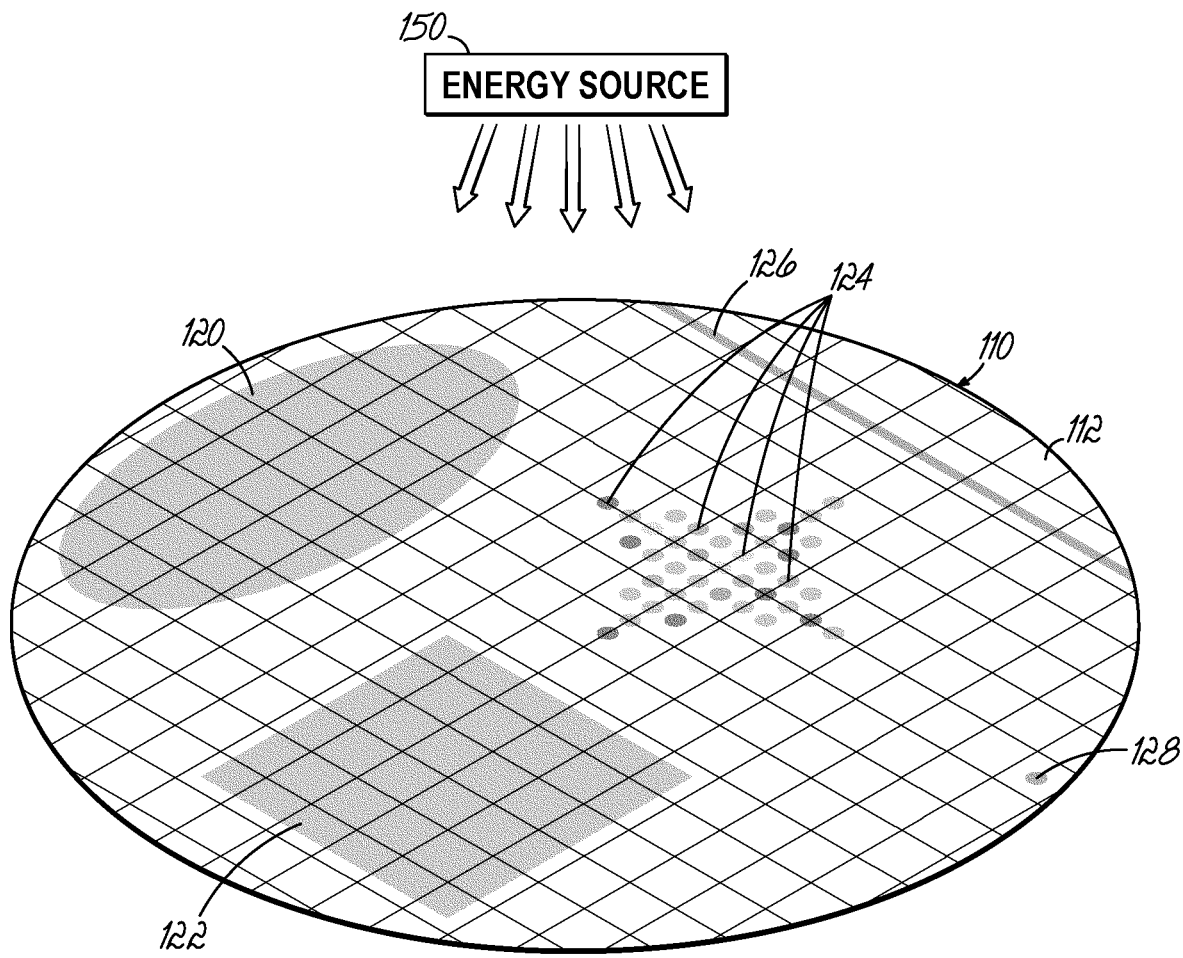
FIG. 1 illustrates a substrate which displays distinct localized zones of applied energy to change the extent of polymerization of the deposited planarization material.

Typically, with device fabrication, it is desirable to achieve a uniform planarization (i.e., flatness) of spin coatings across the substrate. That is, the film that results from the spin coating should have a uniformly flat surface. The resulting uniformity (or lack thereof) of flatness is affected or achieved by many planarization-enhancing factors and actions. These factors and actions can be used to affect individual points across the substrate in the nanometer scale, up to localized regions encompassing larger percentages of the substrate area. Such factors/actions include material properties, underlying topography, and post-application smoothing.

The properties of the materials applied to a substrate affect the resulting flatness of the final layer. Examples of such properties include the viscosity of the coating being dispensed, the amount of material, the location of the material on the substrate, and the timing/speed/acceleration of the spin.

In addition, the underlying topography of the substrate affects the uniformity of the film. Typically, features are etched into the substrate to form the devices. This etching forms a specific topography on the resulting surface. Because of this, this etched or patterned surface is called the "feature topography" herein. Subsequently, the next spin coating is applied to the feature topography. Since the feature topography is not a flat surface, the features affect the coating application and ultimately the uniformity of the resulting film.

Moreover, after a film is applied to a substrate, the film may be non-uniform. This non-flat film can be fixed after application of the coating either mechanically or chemically. That is, the rough or bumpy film may be polished using the appropriate chemicals and/or with a mechanical "polisher."

The micro- and nano-scale electronics processing to build integrated circuits requires multiple film coatings over patterned topography. Deviations in film thickness for spin coatings over patterned topography often drive downstream processing beyond required specifications. The three (3) length scales of interest are substrate scale, die scale, and feature scale.

Unit operations having errors introduced due to deviations in film thickness height include but are not limited to: lithographic CD (critical dimension) changes due to reflectivity, lithographic focus control, etch depth, and subsequent deposition processes. Additionally, novel 3D applications and processes such as pattern reversals and exhuming materials post spacer processes may require stringent levels of film thickness control over topography.

Processing steps to facilitate production of a planar surface can include creating topographic models, predicting polarization strategies, and suggesting remedies following surface profile analysis. However, even those efforts can still result in the "planarization material" surface exhibiting irregularities, with a need for methodology to attain planarity. The techniques herein below provide systems and methods for achieving a surface with enhanced planarity.

Described herein are technologies to facilitate device fabrication, especially those that involve spin coatings of a substrate. More particularly, technologies described herein facilitate the planarization (i.e., flatness) of spin coatings during the device fabrication to form a uniformly planar film or layer on the substrate. In particular, planarization is facilitated by applying a cross-linkable material to the substrate, which material solubility can be adjusted in regions which are exposed to an energy source. More specifically, the material is an acid-catalyzed de-polymerizable cross-linkable material (ACDCM). The ACDCM layer is first rendered less soluble via cross-linking, followed by inducement of an altered solubility in localized regions. The energy source transfers thermal energy into the ACDCM, either directly or via an absorption of light, which is converted to thermal energy. An activation temperature for a polymerization reaction should exceed 140° C. and is often between 150 and 200° C. for at least 60 seconds. Alternatively, the processing conditions for an absorption based heating method (in addition to, or in lieu of, hot plate) can be in the range of 200-500° C. due to the shorter bake cycle (for example often being a bake of 1-20 sec, at a power density of 1-100 W/mm$^2$). Subsequent to rendering the ACDCM layer less soluble, as from a post apply bake operation, the ACDCM layer's insolubility is further facilitated by the application of energy, which promotes cross-linking. Up to a point of reaching virtually complete cross-linking, and thus maximum insolubility, further thermal energy input in the absence of acids created by the action of light energy on a photoacid generator in the coating will continue to facilitate cross-linking in the coating.

A post exposure bake operation introduces additional heat energy into the ACDCM, typically at a lower temperature than encountered in a post apply bake operation. Typically, the post exposure bake operation applies heat to the ACDCM at a temperature of at least 80° C. and are often in the range of about 90 to about 130° C. A photoacid generator (PAG) in the ACDCM will have formed acids as is commonly understood by those of skill in the art, following exposure of the PAG to light. Under post exposure bake conditions, the heat energy after light exposure (and acid generation) induces depolymerization via acid diffusion into the ACDCM, facilitating one or more reactions which in turn break down the polymer chain.

Thus, the coating in the absence of generated acids will further cross-link with the input of more thermal energy. Once acids are formed, though, additional thermal energy tends to facilitate a depolymerization of the polymer chain in areas of the coating wherein acids were generated. Thus, targeted use of light energy can define access in the coating wherein depolymerization will selectively occur, due to the presence of the generated acid and thermal energy. Use of an appropriate solvent in areas of the coating having an altered solubility can then facilitate removal of portions of the coating, which are more depolymerized than adjacent areas.

Described herein is a planarization method, which comprises receiving a substrate with features formed thereupon, the features having varying height or depth; coating the substrate and features with a cross-linkable 6; elevating the temperature of the cross-linkable planarization layer in at least one region thereof to cause the forming of a baseline density of the cross links within the cross-linkable planarization layer; and selectively increasing or decreasing the baseline density of cross links within the cross-linkable planarization layer to decrease or increase the thickness of the cross-linkable planarization layer in the at least one region.

In an alternative embodiment, described herein is a planarization method which comprises receiving a substrate with features formed there upon, the features having varying height or depth; coating the substrate and features with a cross-linkable planarization layer; elevating the temperature of the cross-linkable planarization layer to cause the forming of a baseline density of cross links within the cross-linkable planarization layer; and altering the baseline density of cross links within the cross-linkable planarization layer with a selective heating and/or solvent treatment on a surface of the substrate. A single solvent, or a blend of solvents, can be used for contacting the cross-linkable planarization layer and removing portions of the cross-linkable planarization layer, as a function of the ability of the single solvent or solvent blend to dissolve specific localized portions of this layer. Representative solvents include, but are not limited to, tetramethylammonium hydroxide (TMAH), tetrabutylammonium hydroxide (TBAH), n-butyl acetate (NBA), cyclohexanone, toluene, propylene glycol monomethyl ether acetate (PGMEA), propylene glycol methyl ether (PGME), gamma-butyrolactone (GBL), and combinations thereof.

The process of fabricating typically applies a planarization material to the substrate via spin coating. Planarization material applied onto the substrate typically occupies a defined volume of space as a function of the extent of cross-linking within that material. A cross-linking material over the course of a cross-linking reaction can either experience outgassing, or not. If the material does not experience outgassing as part of the cross-linking reaction process, cross-linking can cause a film thickness change in the range of 10-15%. As a result, the thickness of the cross-linking material layer will shrink, or decrease, by that percentage. Where the cross-linking material does experience outgassing as part of the reaction, the extent of film thickness change can be more significant, on the order of 40-50%. Again, this change is evidenced by a decrease, or shrinking, of the layer thickness.

A class of planarization materials useful in integrated circuit (IC) fabrication as coatings can undergo a de-polymerization reaction in the presence of photo-generated acids after being cross-linked with the input of thermal energy onto the coating. This de-polymerization reaction increases the solubility of the molecular resist material by cleaving the network generated from prior energy input, often, exposing soluble phenolic groups. In practice, fabrication using these planarization materials requires two different solubility-switching reactions. The first insolubilizes the entire film, and the second induces solubility only in exposed regions. The class of planarization materials uses a phenol as the base-solubilizing group.

More broadly, these planarization materials are capable of undergoing a polymerization reaction and also contain pendent hydroxyl groups. Representative classes of compounds containing requisite hydroxyl groups include at least carboxylic acids, phenols, diimides, and dialcohols. Compounds that react with these hydroxyl-containing compounds to form polymeric chains include at least alkenes, alcohols, amines, diamines and carboxylic acids. Other representative materials that undergo cross-linking in the presence of thermal energy, and which can be depolymerized via an acid catalyzed reaction, include epoxy-functional styrene/acrylic oligomers. This latter group of materials, in one application, can be incorporated into degraded condensation resins to re-link broken polymer chains under conditions of heat and pressure typically encountered in an extruder.

As long as the cross-linking material is not fully reacted, allowing further cross-linking to occur, further input of cross-linking energy continues to shrink or decrease the film thickness. The application of cross-linking energy can be tuned to localize the input of that energy to only portions of the film. With continued localized energy input, those exposed surface portions can shrink relative to unexposed portions, thereby altering the overall thickness of the film surface by selective use of thermal cross-linking energy.

Representative compounds that may undergo an acid catalyzed de-polymerization reaction include the reaction product of 1, 1, 1-tris(4-hydroxyphenyl) ethane (identified herein as THPE) with 2-chloroethyl vinyl ether (VE), being materials that can participate in reversible cross-linking reactions. More specifically, the materials can participate in cross-linking reactions, typically thermally driven, involving alkenes and either a phenol or a carboxylic acid as a more specific example of such material. Then, upon creation of acids in the coating via light energy input to a PAG, selective depolymerization of the cross-linked material can be accomplished. One or more solvents capable of preferentially facilitating solvation of the acid-catalyzed, depolymerized material can then be used to remove the depolymerized material.

The material (THPENE) first cross-links through thermally driven phenol-alkene reactions, or using 1,1,2,2-tetra (hydroxyphenyl)ethane TPOE or DPA with carboxylic-alkene reactions to form an insoluble network during the post apply bake fabrication segment. Reaction products can include, for example, THPE-2VE, TPOE-1VE, TPOE-2VE, TPOE-3VE, and DPA-2VE. Adjustment of the post-apply bake temperature allows for the sensitivity to be adjusted without varying the amount of PAB time. Thus, PAB is linked to the extent of cross-linking of the material. The cross-linking reaction generates acetals in the final network. These materials are sensitive to operation by photo-generated acids formed via a light exposure after post apply bake and before post exposure bake to de-polymerize the network and thereby allow higher developer solubility. By adjusting the localized PAB temperature experienced at the film surface, planarization can effectively be modified at both the substrate level and die level, and potentially also the feature level.

Energy imparted to the film surface can be created from a number of distinct sources, such as but not limited to absorption based heating from flash lamp sources in the spectral ranges of MUV, visible light, or near infra-red (of 300 nm-1100 nm); light emitting diodes (in the range typically of 500 nm-1100 nm); lasers, such as diode lasers (500 nm-1100 nm, and particularly—800-1000 nm), and $CO_2$ lasers (9.4 nm and 10.6 nm, and others). In certain instances, the power density of the source will be a factor in ensuring that the correct time and temperature regime is obtained.

To allow for additional processing flexibility, optionally the cross-linkable planarization layer can be exposed to an additional dose, which can then create localized specific concentrations of acids in the ACDCM for later localized depolymerization of the crosslinked network driving post exposure bake of the ACDCM.

Using cross-linking materials of the type described above as the planarization material employed in coating a surface, application of additional energy to localized regions of the coated surface will increase the extent of cross-linking in the localized regions, and can be performed to differing degrees of energy application, in response to an analyzed determination that portions of the coated surface have an increased thickness relative to other regions. Increasing the degree of cross-linking in a region will increase the density of the planarization material, thereby decreasing the measured thickness of the surface. The result is a decrease in the planarization material thickness, and an improvement in the planarity of the treated region relative to adjacent regions.

The localized planarization processes are broadly grouped into four embodiments. In each embodiment the processing begins with an incoming substrate with topography. In each of the four embodiments, the next step in the process is a coating of the substrate with an acid-catalyzed de-polymerizable cross-linkable material (ACDCM). A post applied bake to the ACDCM follows in each of the four embodiments.

The embodiments diverge after the ACDCM coating. In embodiment one, an optional ACDCM absorption based post applied bake step can be employed, which is in addition to or in lieu of a traditional hot plate heating step. These optional absorption based heating methods often offer significantly higher spatial resolution of localized thermal energy. Alternatively, the zonal control of the traditional hot plate can also be used. The zone of the additional heating is a function of the spacing and configuration of the zonal plates used to supply the heat. As an example, the hot plate surface may consist actually of 15 zonal plates, all or a portion thereof being employed to provide additional heat energy to the ACDCM layer. An optional film thickness/planarization inspection may follow.

The remaining steps in this process involving embodiment one are those practiced for all of the four embodiments, that being an antireflection coating layer, such as a silicon anti-reflection coating (ARC), coating; a post apply bake of the antireflection coating layer; a photoresist material coat; a photoresist material post apply bake; an exposure step; a post exposure bake; and finally a development step.

In embodiment two, the ACDCM PAB step is followed by a uniform flood operation. Then, the ACDCM receives a post exposure bake step, and an optional absorption based post exposure bake step. The absorption based post exposure bake step can be employed, in addition to or in lieu of a traditional hot plate heating step. Again, these optional absorption based heating methods often offer significantly higher spatial resolution of localized thermal energy. Alternatively, the zonal control of the traditional hot plate can also be used. The zone of the additional heating is a function of the spacing and configuration of the zonal plates used to supply the heat. As an example, the hot plate surface may consist actually of 15 zonal plates, all or a portion thereof may be employed to provide additional heat energy to the ACDCM layer. Finally, there is an optional ACDCM development step, followed by the remaining steps as noted above for development for embodiment one, beginning with an optional planarization inspection step and ending with a developer step.

Embodiment number three varies from the prior embodiments in that, after the ACDCM post apply bake step, the ACDCM exposure step utilizes a location specific controlled flood. The energy imparted by the flood onto the substrate surface is optionally uniformly distributed onto the treated surface. To average out any localized energy variances, the substrate can be rotated during the exposure sequence. Thereafter, the ACDCM layer is treated to a post exposure bake step, with an optional developer step, and then an optional planarization inspection and the remaining same series of processing steps as above.

In comparing the process in embodiment number two with that of embodiment three, the dimensions to be affected in the planarization process for these two embodiments are distinct. Embodiment two is intended to work largely at the substrate level, and planarizes the surface using post exposure bake thermal energy applied after acids in the ACDCM layer have been activated by the uniform flood light energy. In embodiment three, the dimensions in issue are at the feature level, with spot-based light energy treatment provided using a glavo mirror or DLP as examples. In embodiment three, planarization is accomplished using the acid generation step itself.

Embodiment number four, after the ACDCM post apply bake step, utilizes an ACDCM exposure step with a mask pattern exposure. Thereafter, there is a post exposure bake step, an optional ACDCM developer step, and then the optional planarization inspection and the remaining processing steps.

The distinct embodiments use the following combinations of coating thickness adjustment tools applied to the ACDCM layer, after post-apply bake. Embodiment one selectively uses additional localized thermal energy sources to vary the degree of cross-linking across the coating. Embodiment two uses a uniform light energy input followed by localized thermal energy to depolymerize the cross-linked material via acid catalysis, followed by a developer step. Embodiment three uses a controlled selective light energy input to selectively convert the PAG into acids that results in depolymerized portions of the coating, followed by a developer step. And embodiment four uses a mark pattern exposure in place of a uniform or controlled flood to form the acid which in turn depolymerizes portions of the coating.

EXAMPLE SCENARIO

The examples described below refer to various planarization methods which could be employed to adjust the thickness of localized regions on the substrate surface. Certain features of the planarization methods, though described elsewhere in the specification, may not be expressly described in the example scenarios to follow.

In FIG. 1, the substrate 110 receives a coating layer 112. In exemplary fashion, regions 120 and 122 depict zones on coating layer 112 that exhibit more thickness relative to the surrounding areas, and which would receive a localized input of energy from energy source 150 to adjust the degree of cross-linking in regions 120 and 122 and as a result, the thickness of coating layer 112 in those regions. A similar effect is obtained in region 124, though here the individual dot patterns depict differing micro-elevations, requiring differing intensities of input energy to modify the degree of cross-linking in those micro-regions, and thereby the ultimate thickness. A similar effect can be achieved along line 126.

In production of the coating layer 112, examples of planar film thicknesses range from 100 nm to 2 um. The planar film thickness may be expressed as a height over a distance value. Examples of material properties include density, viscosity, surface tension, and vapor pressure. Examples of spin-on process conditions include a spin speed of 2000 RPM and post apply bake of 60 sec at 100 C.

Figure 2:
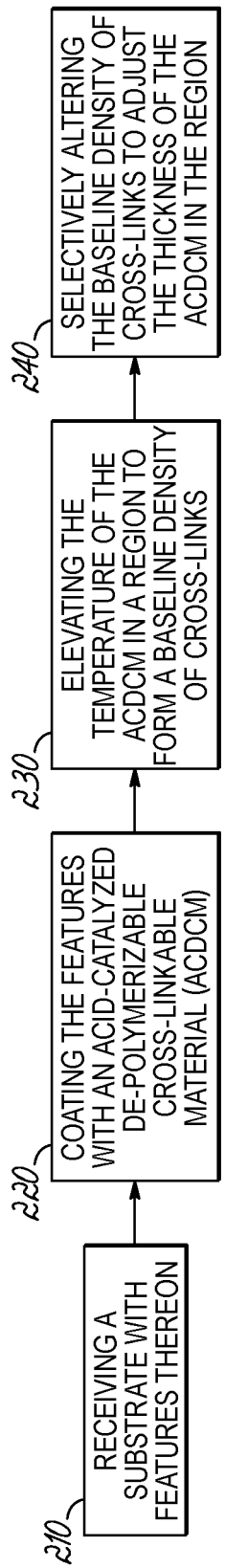
FIG. 2 provides a flow chart illustrating a method of facilitating planarizing a substrate in accordance with the technology described herein.

FIG. 2 sets out a flow chart, which illustrates a method of facilitating the planarization of a substrate in accordance with the described technology. The process begins with receipt of a substrate having features thereon, as noted at 210. In 220, the substrate features are coated with an acid catalyzed depolymerizable cross-linkable material (ACDCM). Following this coating step, at 230, the temperature of the coated substrate is raised, such as via a post-apply bake step, to form a baseline density of cross-links spanning the dimensions of the coated substrate. Finally, at 240, the baseline density of those cross-links on the substrate are altered, to thereby adjust the thickness of the ACDCM in particular regions of the coated substrate.

Figure 3:
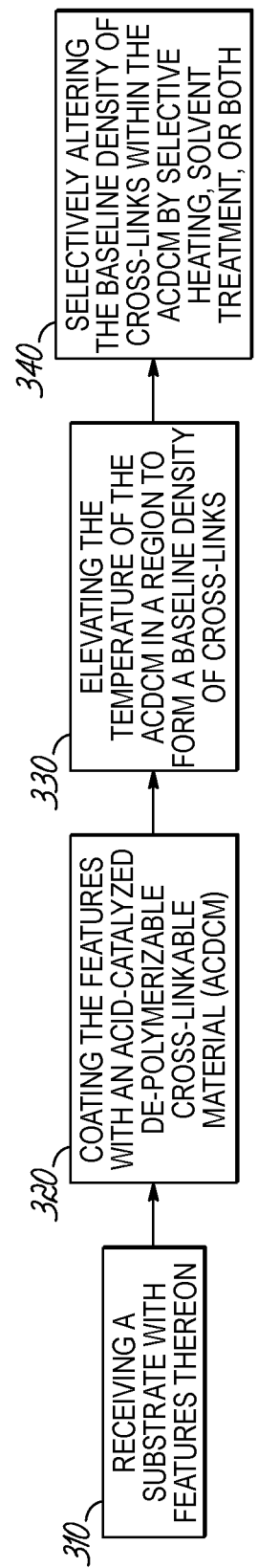
FIG. 3 provides a flow chart illustrating an alternate method of planarizing a substrate in accordance with the technology described herein.

FIG. 3 sets out a flow chart, which illustrates a method of facilitating the planarization of a substrate in accordance with the described technology. The process begins with receipt of a substrate having features thereon, as noted at 310. In 320, the substrate features are coated with an acid catalyzed depolymerizable cross-linkable material (ACDCM). Following this coating step, at 330, the temperature of the coated substrate is raised, such as via a post-apply bake step, to form a baseline density of cross-links spanning the dimensions of the coated substrate. After the baseline density of cross-links as formed, at 340, that baseline density is selectively altered within the ACDCM by a selective heating step, which can further cross-link localized sections of the coated substrate to thereby alter the degree of cross-linking and thus the thickness of the coating. Alternatively, a combination of application of light energy to initiate acid formation within the coating and resulting depolymerization, can be further treated with a solvent in a developer step to remove the coating material that has been depolymerized and then solvated. As a further alternative, both the steps of selective heating and acid formation/solvent treatment can be utilized.

Figure 4:
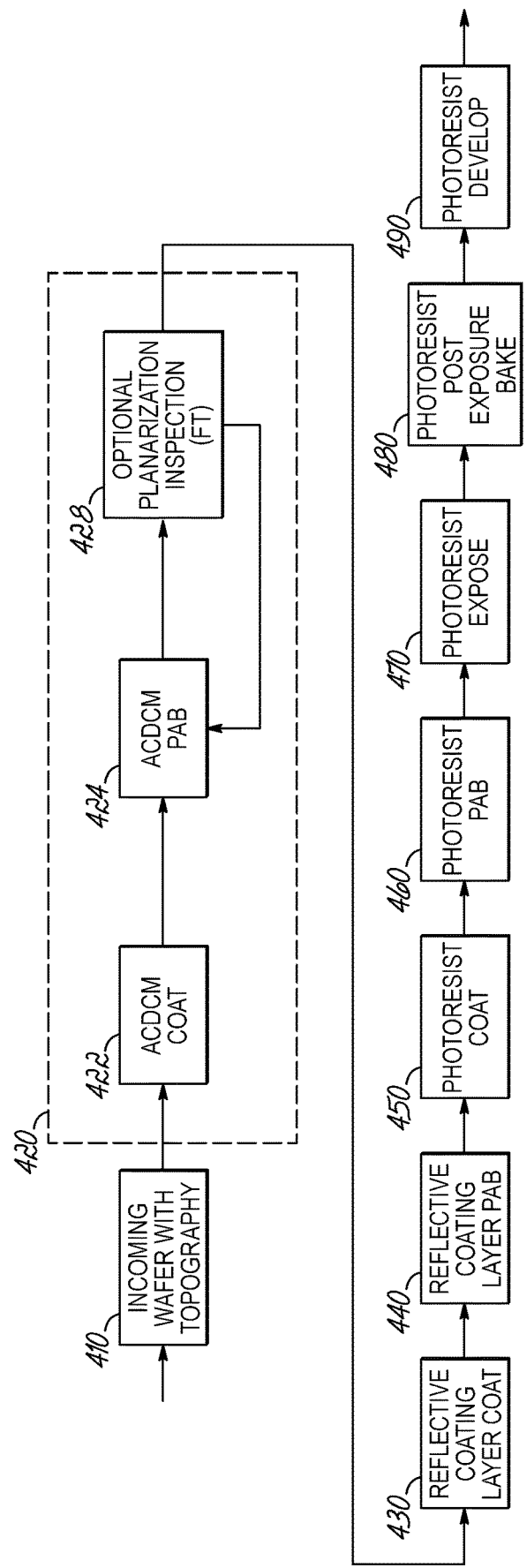
FIG. 4 provides a flow chart illustrating an exemplary method of applying a coating of cross-linkable material to a substrate with further processing via the technology described herein to facilitate substrate surface planarization.

FIG. 4 outlines the procedure for coating, and then planarizing a substrate having cross-linkable material thereon, generally as described above as embodiment one. An incoming substrate having topography as noted in 410 receives a thermal treatment step as set out in the sector identified as 420. Therein, the ACDCM coating layer is applied to the substrate, at 422. That coating layer is subjected to a post apply bake step at 424. There is an optional planarization inspection step, typically via a Fourier Transform process at 428. After the planarization process is complete in 420, the coated substrate is then subjected to a reflective coating layer coat at 430, and a reflective coating layer post apply bake step at 440. Then, a photo resist coat and photo resist post apply bake is carried out on the coated substrate, at 450 and 460. The so treated coated substrate is then exposed to light energy at 470, which would generate acid in areas subjected to the light energy. Those acids then induce photoresist polymer deprotection via the post exposure bake step at 480. Finally, the coating is subjected to a development step at 490. Selectivity of the process is further enhanced by the use of photoacid generators (PAGs) within the ACDCM, which will absorb within a distinctly different wavelength regime than the PAG within the photoresist.

Figure 5:
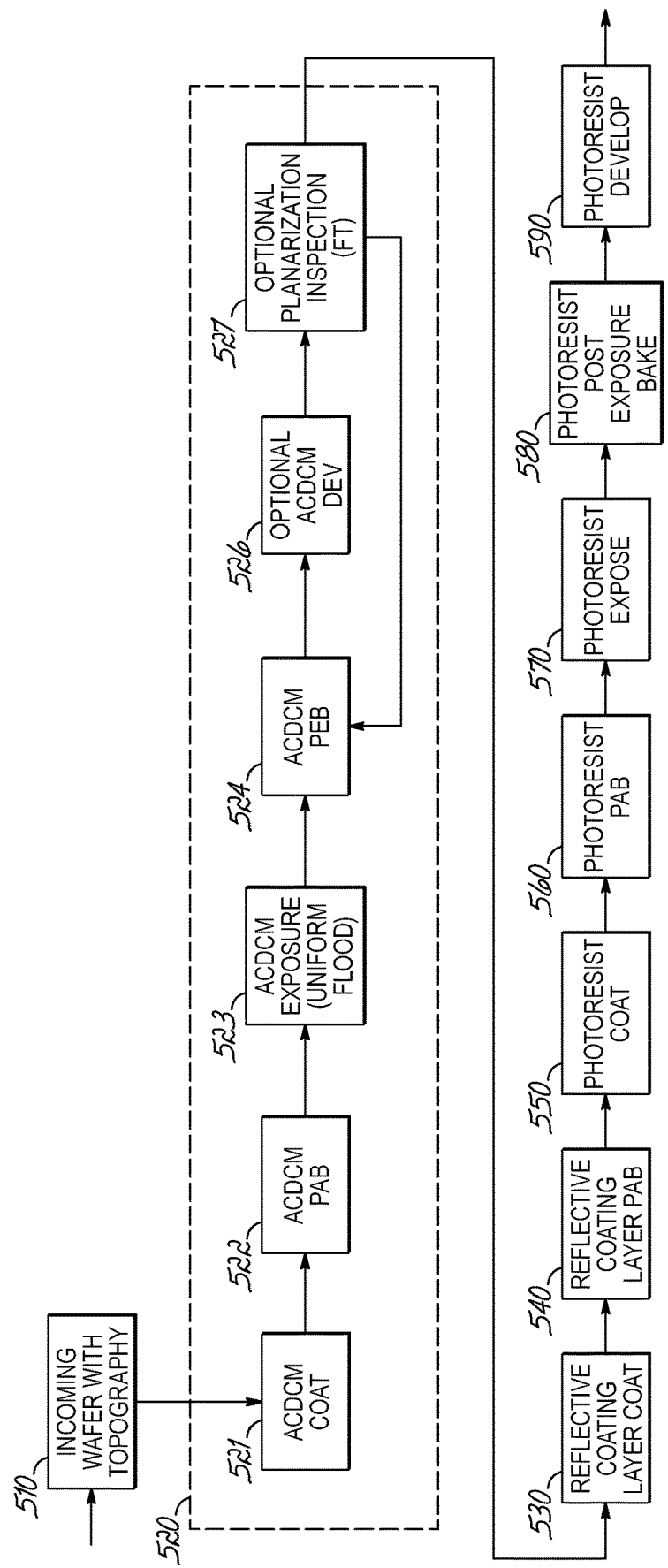
FIG. 5 provides a flow chart illustrating an alternate exemplary method of applying a coating of cross-linkable material to a substrate with further processing via the technology described herein to facilitate substrate surface planarization.

FIG. 5 outlines the procedure for coating, and then planarizing a substrate having cross-linkable material thereon, generally as described above as embodiment 2. An incoming substrate having topography as noted in 510 receives a thermal treatment step as set out in the sector identified as 520. Therein, the ACDCM coating layer is applied to the substrate, at 521, and that coating layer is subjected to a post apply bake step at 522. To activate acids within the coating, a uniform flood is employed to introduce light energy, at 523. Following this step, the coating receives a post exposure bake at 524 to depolymerize a portion of the coating, an optional developer stage at 526, and an optional planarization inspection step, typically via a Fourier Transform process at 527.

After the planarization process is complete in 520, the coated substrate is then subjected to a reflective coating layer coat at 530, and a reflective coating layer post apply bake step at 540. Then, a photo resist coat and photo resist post apply bake is carried out on the coated substrate, at 550 and 560. The so treated coated substrate is then exposed to light energy at 570, which would generate acid in areas subjected to the light energy. Those acids then induce photoresist polymer deprotection via the post exposure bake step at 580. Finally, the coating is subjected to a development step at 590.

Figure 6:
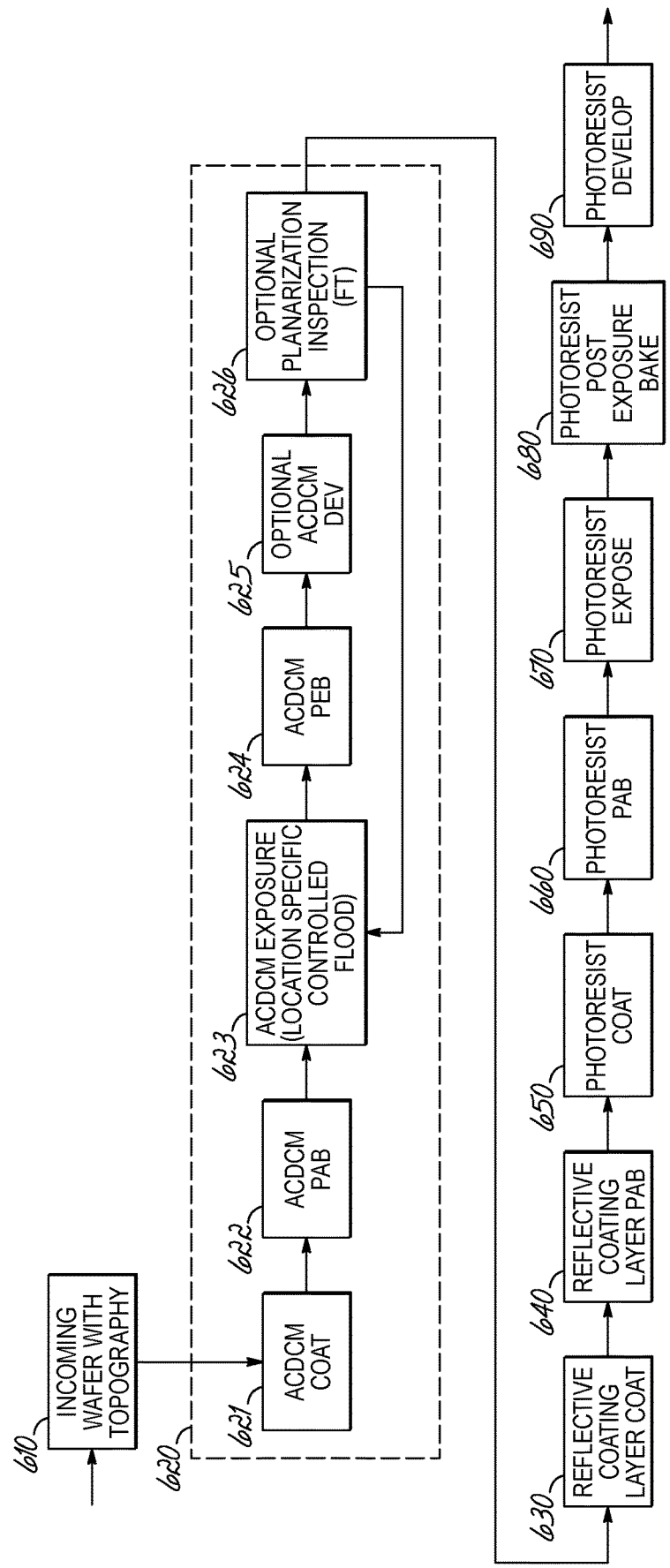
FIG. 6 provides a flow chart illustrating an alternate exemplary method of applying a coating of cross-linkable material to a substrate with further processing via the technology described herein to facilitate substrate surface planarization.

FIG. 6 outlines the procedure for coating, and then planarizing a substrate having cross-linkable material thereon, generally as described above as embodiment 3. An incoming substrate having topography as noted in 610 receives a thermal treatment step as set out in the sector identified as 620. Therein, the ACDCM coating layer is applied to the substrate, at 621, and that coating layer is subjected to a post apply bake step at 622. To activate acids within the coating, a dose controlled location specific flood is employed to introduce light energy, at 623, such as for example a glavo mirror or DLP. Following this step, the coating receives a post exposure bake at 624 to depolymerize a portion of the coating, an optional developer stage at 625, and an optional planarization inspection step, typically via a Fourier Transform process at 626.

After the planarization process is complete in 620, the coated substrate is then subjected to a reflective coating layer coat at 630, and a reflective coating layer post apply bake step at 640. Then, a photo resist coat and photo resist post apply bake is carried out on the coated substrate, at 650 and 660. The so treated coated substrate is then exposed to light energy at 670, which would generate acid in areas subjected to the light energy. Those acids then induce photoresist polymer deprotection via the post exposure bake step at 680. Finally, the coating is subjected to a development step at 690.

Figure 7:
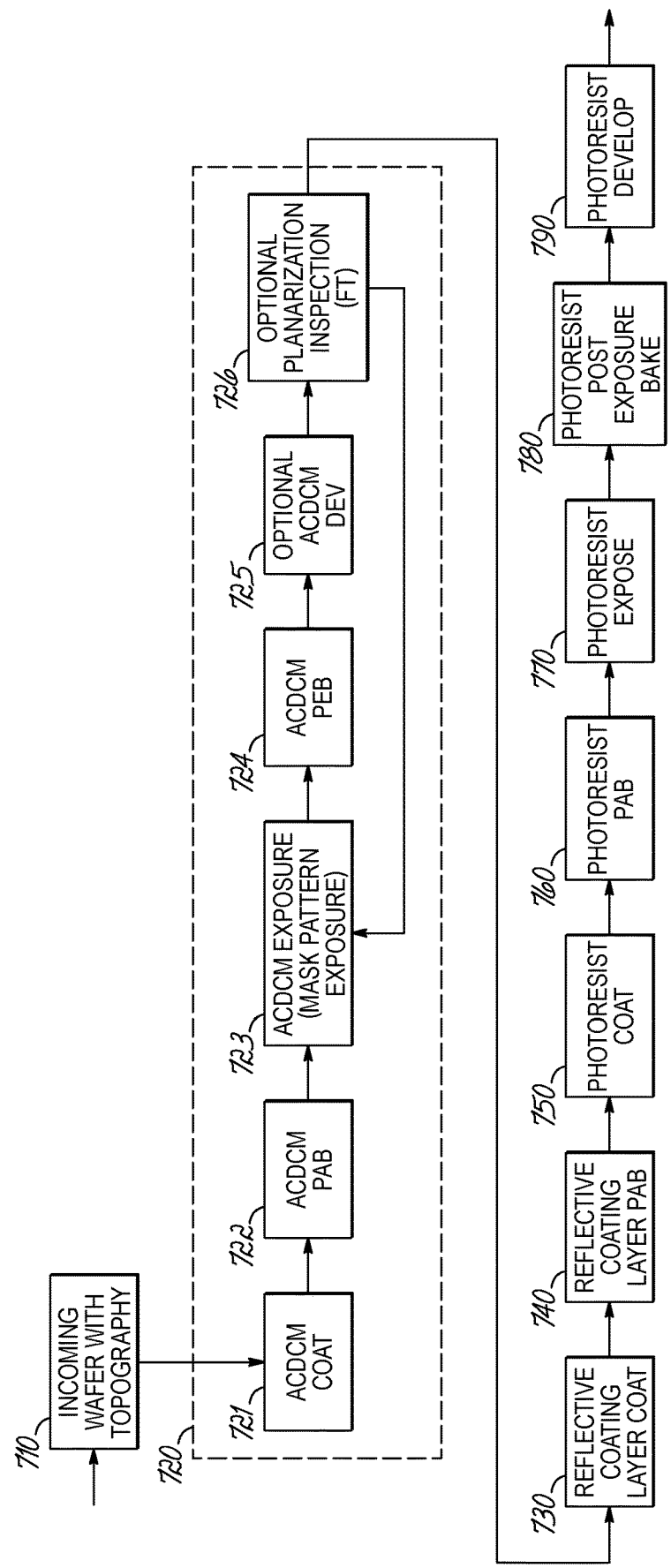
FIG. 7 provides a flow chart illustrating an alternate exemplary method of applying a coating of cross-linkable material to a substrate with further processing via the technology described herein to facilitate substrate surface planarization.

FIG. 7 outlines the procedure for coating, and then planarizing a substrate having cross-linkable material thereon, generally as described above as embodiment 4. An incoming substrate having topography as noted in 710 receives a thermal treatment step as set out in the sector identified as 720. Therein, the ACDCM coating layer is applied to the substrate, at 721, and that coating layer is subjected to a post apply bake step at 722. To activate acids within the coating, a mask pattern exposure is employed to introduce light energy, at 723. Following this step, the coating receives a post exposure bake at 724 to depolymerize a portion of the coating, an optional developer stage at 725, and an optional planarization inspection step, typically via a Fourier Transform process at 726.

After the planarization process is complete in 720, the coated substrate is then subjected to a reflective coating layer coat at 730, and a reflective coating layer post apply bake step at 740. Then, a photo resist coat and photo resist post apply bake is carried out on the coated substrate, at 750 and 760. The so treated coated substrate is then exposed to light energy at 770. Those acids then induce photoresist polymer deprotection via the post exposure bake step at 780. Finally, the coating is subjected to a development step at 790.

While the present invention has been illustrated by a description of various embodiments, and while these embodiments have been described in some detail, they are not intended to restrict or in any way limit the scope of the appended claims to such detail. Additional advantages and modifications will readily appear to those skilled in the art. The various features of the invention may be used alone or in any combination depending on the needs and preferences of the user. This has been a description of the present invention, along with methods of practicing the present invention as currently known. However, the invention itself should only be defined by the appended claims.

The invention claimed is:

1. A planarization method, comprising:
   coating a substrate with features formed thereupon and having varying height or depth with a cross-linkable planarization layer;
   elevating the temperature of the cross-linkable planarization layer in at least one region thereof to cause the forming of a baseline density of cross-links within the cross-linkable planarization layer; and
   selectively increasing or decreasing the baseline density of cross-links within the cross-linkable planarization layer to decrease or increase the thickness of the cross-linkable planarization layer in the at least one region.

2. The method of claim 1, wherein the cross-linkable planarization layer undergoes cross-linking via phenol-alkene, carboxylic-alkene, or dianhydride reactions upon exposure to elevated temperature.

3. The method of claim 1, wherein the cross-linkable planarization layer comprises a reaction product of 1,1,1-tris(4-hydroxyphenyl)ethane (THPE), 1,1,2,2-tetra(hydroxyphenyl)ethane (TPOE), or both, and 2-chloroethyl vinyl ether (VE).

4. The method of claim 1, wherein the elevating the temperature of the cross-linkable planarization layer is varied across the substrate to cause a varying change of thickness of the cross-linkable planarization layer across the substrate, to form a substantially planar upper surface of the cross-linkable planarization layer.

5. The method of claim 4 wherein the elevating the temperature of the cross-linkable planarization layer in the at least one region causes a decrease of thickness of the cross-linkable planarization layer in that region.

6. The method of claim 4, wherein the elevating the temperature comprises applying energy to the substrate with the cross-linkable planarization layer using a hot plate, or heating the cross-linkable planarization layer with absorption based heating, or both.

7. The method of claim 6, wherein the hot plate is a zoned hot plate.

8. The method of claim 6, wherein the absorption based heating is provided by a broadband flash lamp, a light-emitting diode, a diode laser, a $CO_2$ laser, or combinations thereof.

9. The method of claim 8, wherein a dose of absorption based heating is varied across the substrate by using a pixel-based projection system, using an electromagnetic beam scanning system, translation of the substrate during exposing, rotating the substrate during exposing, or combinations thereof.

10. The method of claim 1, further comprising:
developing the cross-linkable planarization layer, after applying energy to the substrate or heating the cross-linkable planarization layer.

11. The method of claim 1 wherein the cross-linkable planarization layer is an acid catalyzed depolymerizable cross-linkable planarization layer.

12. The method of claim 1 wherein the cross-linkable planarization layer includes a photo acid generator, and the photo acid generator is selectively exposed in a zone to generate an acid catalyzed de-polymerization reaction to thereby change the cross-links in the zone.

13. A planarization method, comprising:
receiving a substrate with features formed thereupon, the features having varying height or depth;
coating a substrate with features formed thereupon and having varying height or depth with a cross-linkable planarization layer;
elevating the temperature of the cross-linkable planarization layer to cause the forming of a baseline density of cross-links within the cross-linkable planarization layer, and
altering the baseline density of cross-links within the cross-linkable planarization layer with selective heating.

14. The method of claim 13 wherein the cross-linkable planarization layer includes a photo acid generator, and the photo acid generator is selectively exposed in a zone to generate an acid catalyzed de-polymerization reaction to thereby change the cross-links in the zone.

15. The method of claim 13, wherein the cross-linkable planarization layer undergoes cross-linking via phenol-alkene, carboxylic-alkene, or dianhydride reactions upon exposure to elevated temperature.

16. The method of claim 13, wherein the cross-linkable planarization layer comprises the reaction product of 1,1,1-tris(4-hydroxyphenyl)ethane (THPE), 1,1,2,2-tetra(hydroxyphenyl)ethane (TPOE), or both, and 2-chloroethyl vinyl ether (VE).

17. The method of claim 13, wherein the elevating the temperature of the cross-linkable planarization layer is varied across the substrate post exposure of the photo acid generator, to cause a varying baseline density of cross-links within the cross-linkable planarization layer, across the substrate.

18. The method of claim 17, wherein the elevating the temperature comprises applying energy to the substrate with the cross-linkable planarization layer on a hot plate, or heating the cross-linkable planarization layer with electromagnetic radiation, or both.

19. The method of claim 18, wherein the hot plate is a zoned hot plate.

20. The method of claim 18, wherein the electromagnetic radiation is provided by a broadband flash lamp, a light-emitting diode, a diode laser, a $CO_2$ laser, or combinations thereof.

21. The method of claim 20, wherein a dose of electromagnetic radiation is varied across the substrate by using a pixel-based projection system, using an electromagnetic beam scanning system, translation of the substrate during exposing, rotating the substrate during exposing, or combinations thereof.

22. The method of claim 13, wherein the altering the baseline density of cross-links is varied across the substrate, to cause a varying change of thickness of the cross-linkable planarization layer across the substrate, to form a substantially planar upper surface of the cross-linkable planarization layer.

23. The method of claim 22, wherein the altering the baseline density of cross-links comprises baking the substrate with the cross-linkable planarization layer on a hot plate, or heating the cross-linkable planarization layer with a first absorption based hearing heating method, or both.

24. The method of claim 23, wherein the hot plate is a zoned hot plate.

25. The method of claim 23, wherein the first absorption based heating method is provided by a broadband flash lamp, a light-emitting diode, a diode laser, a $CO_2$ laser, or combinations thereof.

26. The method of claim 23, wherein a dose of first absorption based heating is varied across the substrate by using a pixel-based projection system, using an electromagnetic beam scanning system, translation of the substrate during exposing, rotating the substrate during exposing, or combinations thereof.

27. The method of claim 23, further comprising:
exposing the cross-linkable planarization layer to a distinct heating operation via a hot plate method, an absorption based heating method, or both, prior to applying energy to the substrate or heating the cross-linkable planarization layer with the first absorption based heating method.

28. The method of claim 27, wherein the distinct heating operation is provided by a broadband flash lamp, a light-emitting diode, a diode laser, a frequency-tripled Nd:YAG laser, a frequency-quadrupled Nd:YAG laser, or combinations thereof.

29. The method of claim 28, wherein the distinct heating operation is flood exposed upon the cross-linkable planarization layer, or a dose of second electromagnetic radiation is varied across the substrate, or both.

30. The method of claim 29, wherein the dose of distinct heating operation is varied using a pixel-based projection system or an electromagnetic beam scanning system.

31. The method of claim 28, wherein the substrate is translated, or rotated, or both, during the exposing the cross-linkable planarization layer to the distinct heating operation.

32. The method of claim 23, further comprising:
developing the cross-linkable planarization layer after applying energy to the substrate or heating the cross-linkable planarization layer.

33. The method of claim 13, wherein an application of photolytic light energy precedes said selective heating.

34. The method of claim 33, wherein said photolytic light energy is uniformly applied across said substrate.

35. The method of claim 33, wherein said photolytic light energy is selectively applied across said substrate.

36. A planarization method, comprising:
receiving a substrate with features formed thereupon, the features having varying height or depth; and coating a substrate with features formed thereupon and having varying height or depth with a cross-linkable planarization layer; wherein the cross-linkable planarization layer includes a photo acid generator and the photo acid generator is selectively exposed in a zone to generate an acid catalyzed de-polymerization reaction to thereby change the cross-links in the zone.

37. The method of claim 36, wherein the substrate comprises a photoresist, said photoresist comprising a photo acid generator with an activation frequency distinct from an activation frequency of said cross-linkable planarization layer.

* * * * *

UNITED STATES PATENT AND TRADEMARK OFFICE
CERTIFICATE OF CORRECTION

| | |
|---|---|
| PATENT NO. | : 11,262,657 B2 |
| APPLICATION NO. | : 16/511211 |
| DATED | : March 1, 2022 |
| INVENTOR(S) | : Michael A. Carcasi et al. |

It is certified that error appears in the above-identified patent and that said Letters Patent is hereby corrected as shown below:

In the Claims

Column 12, Line 31, Claim 23, "a first absorption based hearing heating method" should read -- a first absorption based heating method --.

Signed and Sealed this
Thirty-first Day of May, 2022

Katherine Kelly Vidal
*Director of the United States Patent and Trademark Office*